(12) United States Patent
Ma et al.

(10) Patent No.: US 10,778,227 B2
(45) Date of Patent: Sep. 15, 2020

(54) LEVEL SHIFTING CIRCUIT AND METHOD

(71) Applicant: SMARTER MICROELECTRONICS (SHANGHAI) CO., LTD., Shanghai (CN)

(72) Inventors: Jun Ma, Shanghai (CN); Xin Wang, Shanghai (CN); Jiangtao Yi, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/577,979

(22) Filed: Sep. 20, 2019

(65) Prior Publication Data

US 2020/0014386 A1 Jan. 9, 2020

Related U.S. Application Data

(63) Continuation of application No. PCT/CN2017/113622, filed on Nov. 29, 2017.

(30) Foreign Application Priority Data

Mar. 22, 2017 (CN) .......................... 2017 1 0173802

(51) Int. Cl.
*H03K 19/0185* (2006.01)

(52) U.S. Cl.
CPC .......................... *H03K 19/018507* (2013.01)

(58) Field of Classification Search
None
See application file for complete search history.

(56) References Cited

U.S. PATENT DOCUMENTS

2014/0210517 A1* 7/2014 Schrom .............. H03K 19/0185
326/80

* cited by examiner

*Primary Examiner* — Seokjin Kim
(74) *Attorney, Agent, or Firm* — Syncoda LLC; Feng Ma

(57) ABSTRACT

A level shifting circuit includes a shift circuit configured to output first and second voltage signals according to level signals, and an input circuit configured to carry out inversion and delay operations on input level signals to obtain first, second, third, and fourth level signals. Rising edge of the first level signal is earlier than falling edge of the second level signal by a first preset time. Falling edge of first level signal is later than rising edge of the second level signal by a second preset time; the third level signal is obtain by delaying the first level signal by a third preset time, and the fourth level signal is obtain by delaying the second level signal by a fourth preset time; the first preset time is longer than the third preset time, and the second preset time is longer than the fourth preset time.

9 Claims, 4 Drawing Sheets

LEVEL SHIFTING CIRCUIT AND METHOD

CROSS-REFERENCE TO RELATED APPLICATIONS

The present application is a continuation of, and claims priority to, PCT/CN2017/113622 filed on Nov. 29, 2017, which claims priority to Chinese Patent Application No. 201710173802.6 filed on Mar. 22, 2017. The disclosures of these applications are hereby incorporated by reference in their entirety.

BACKGROUND

A level shifting circuit is widely applied in various interface circuits and input and output units, for implementing logic shifting of a level. FIG. 1 is a schematic structural diagram of a circuit for implementing level shifting in design for an integrated circuit. The level shifting circuit is generally used for shifting a logic level from a ground level GND to a positive power supply VDD to a logic level from a negative power supply VNEG to the positive power supply VDD. For example, a voltage ranging from 0 to 2.5 V may be shifted to a voltage ranging from −2.5 to 2.5 V. Referring to FIG. 1, the level shifting circuit includes 16 Metal-Oxide Semiconductor Field Effect Transistors (MOS-FET), which are respectively represented as M1 to M16. M1 to M4 are MOS transistors for shifting the level. M5-M8, as buffer structures, may have high current driving capability. M9 to M16 share a high voltage between a positive voltage VDD and the negative power supply VNEG so as to avoid overvoltage of the MOS transistors.

The circuit structure for implementing level shifting in the design for the integrated circuit is simply introduced above. An operation principle of the level shifting circuit is described in detail below. In a case that an input level signal Sp is a ground level GND, since a voltage between a source electrode and a gate electrode of M4 is greater than a threshold voltage Vthp of a PMOS transistor, M4 is switched on. A source voltage of M12 increases due to the switch-on of M4, and a voltage between a source electrode and a gate electrode of M12 is greater than a threshold voltage Vthp of the PMOS transistor, and thus the M12 is switched on. A drain voltage of M10 is increased due to the switch-on of the M4 and M12, since the voltage between a gate electrode of M10 and a source electrode of M2 is a difference between the ground level GND and the negative power supply VNEG, an equivalent capacitance is between a gate electrode and a source electrode of M10, an equivalent on-resistance or off-capacitance is between a drain electrode and a source electrode of M2. A voltage is shared between the gate electrode and the source electrode of M10, and the voltage is higher than a threshold voltage Vthn of a NMOS and is large enough to switch on M10. Further, M1, M2, M5 and M6 are initially in switch-off states, a current path formed by the switch-on of M4, M12 and M10 charges gate electrodes of M1 and M6, so as to enable M1 and M6 be switched on. Gate voltages of M5 and M2 decrease due to the switch-on of M1, so as to enable M5 and M2 to be switched off and keep M2 in a switch-off state. A source voltage of M14 decreases due to the switch-on of the M6, to enable a voltage between a gate electrode and a source electrode of M14 to be higher than the threshold voltage Vthn of the NMOS, and M14 is switched on. M8 is in the switch-off state due to an inverted signal Sn of Sp. In this case, an output signal Vp is the negative power supply VNEG. Similarly, in a case that the input level signal Sp is the positive power supply VDD, an output voltage signal Vp is the positive power supply VDD. It can be known from the operation principle analyzed above that with the level shifting circuit, the logic level from the ground level GND to the positive power supply VDD is shifted to a logic level from a negative power supply VNEG to the positive power supply VDD.

However, due to simultaneous shifting of the level signals during the process of shifting the input level signal Sp, M1 and M3 may be simultaneously switched on, M2 and M4 may be simultaneously switched on, M5 and M7 may be simultaneously switched on, M6 and M8 may be simultaneously switched on, and further a loop is generated between the positive power supply VDD and the negative power supply VNEG, resulting in electric leakage. Therefore, not only more dynamic current is consumed, but also more glitches are produced on edges of output voltage signal, and it is difficult to provide a control level with high quality to a post-stage circuit.

SUMMARY

The disclosure relates to the technical field of integrated circuits, and in particular to a level shifting circuit and method.

It is desirable to provide a level shifting circuit and method according to the embodiments of the disclosure.

A level shifting circuit is provided according to an embodiment of the disclosure. The circuit includes an input circuit and a shifting circuit connected with the input circuit.

The input circuit is configured to perform inversion and delay operations on an input level signal to obtain a first level signal, a second level signal, a third level signal and a fourth level signal.

A rising edge of the first level signal occurs a first preset time earlier than a falling edge of the second level signal. A falling edge of the first level signal occurs a second preset time later than a rising edge of the second level signal. The third level signal is a signal obtained by delaying the first level signal for a third preset time. The fourth level signal is a signal obtained by delaying the second level signal for a fourth preset time. The first preset time is longer than the third preset time; and the second preset time is longer than the fourth preset time.

The shifting circuit is configured to output a first voltage signal and a second voltage signal based on the level signals. The first voltage signal and the second voltage signal are inverted with each other.

In the above solution, the input circuit includes a first inverter, an RS trigger connected with the first inverter, a first delayer connected with a first output terminal of the RS trigger and a second delayer connected with a second output terminal of the RS trigger.

The first inverter is configured to invert an input signal to obtain an inverted signal of the input signal.

The RS trigger is configured to obtain the first level signal and the second level signal based on the input signal and the inverted signal of the input signal.

The first delayer is configured to delay the first level signal to obtain the third level signal.

The second delayer is configured to delay the second level signal to obtain the fourth level signal.

In the above solution, the first delayer includes an even number of second inverters, or a first transmission gate configured for delaying.

In the above solution, the second delayer includes an even number of third inverters, or a second transmission gate configured for delaying.

In the above solution, the shifting circuit includes a control sub-circuit, and a first output sub-circuit and a second output sub-circuit which are connected with the control sub-circuit.

The control sub-circuit is configured to convert the first level signal to a first driving signal, and convert the second level signal into a second driving signal.

The first output sub-circuit is configured to output the first voltage signal based on the fourth level signal and the first driving signal.

The second output sub-circuit is configured to output the second voltage signal based on the third level signal and the second driving signal.

In the above solution, the control sub-circuit includes a first PMOS transistor, a second PMOS transistor, a third PMOS transistor, a fourth PMOS transistor, a first NMOS transistor, a second NMOS transistor, a third NMOS transistor and a fourth NMOS transistor.

A gate electrode of the first PMOS transistor is connected with the first output terminal, a source electrode of the first PMOS transistor is connected with a first preset voltage source, and a drain electrode of the first PMOS transistor is connected with a source electrode of the second PMOS transistor.

A gate electrode of the second PMOS transistor is connected with a ground terminal, and a drain electrode of the second PMOS transistor is connected with a drain electrode of the first NMOS transistor.

A gate electrode of the third PMOS transistor is connected with the second output terminal, a source electrode of the third PMOS transistor is connected with the first preset voltage source, and a drain electrode of the third PMOS transistor is connected with a source electrode of the fourth PMOS transistor.

A gate electrode of the fourth PMOS transistor is connected with the ground terminal, and a drain electrode of the fourth PMOS transistor is connected with a drain electrode of the third NMOS transistor.

A gate electrode of the first NMOS transistor is connected with the ground terminal, and a source electrode of the first NMOS transistor is connected with a drain electrode of the second NMOS transistor.

A gate electrode of the second NMOS transistor is connected with a source electrode of the third NMOS transistor, and a source electrode of the second NMOS transistor is connected with a second preset voltage source.

A gate electrode of the third NMOS transistor is connected with the ground terminal, and a source electrode of the third NMOS transistor is connected with a drain electrode of the fourth NMOS transistor.

A gate electrode of the fourth NMOS transistor is connected with the source electrode of the first NMOS transistor, and a source electrode of the fourth NMOS transistor is connected with the second preset voltage source.

In the above solution, the first output sub-circuit includes a fifth PMOS transistor, a sixth PMOS transistor, a fifth NMOS transistor and a sixth NMOS transistor.

A gate electrode of the fifth PMOS transistor is connected with an output terminal of the second delayer, a source electrode of the fifth PMOS transistor is connected with the first preset voltage source, and a drain electrode of the fifth PMOS transistor is connected with a source electrode of the sixth PMOS transistor.

A gate electrode of the sixth PMOS transistor is connected with the ground terminal, and a drain electrode of the sixth PMOS transistor is connected with a drain electrode of the fifth NMOS transistor.

A gate electrode of the fifth NMOS transistor is connected with the ground terminal, and a source electrode of the fifth NMOS transistor is connected with a drain electrode of the sixth NMOS transistor.

A gate electrode of the sixth NMOS transistor is connected with the drain electrode of the second NMOS transistor, and the source electrode of the sixth NMOS transistor is connected with the second preset voltage source.

In the above solution, the second output sub-circuit includes a seventh PMOS transistor, an eighth PMOS transistor, a seventh NMOS transistor and an eighth NMOS transistor.

A gate electrode of the seventh PMOS transistor is connected with an output terminal of the first delayer, a source electrode of the seventh PMOS transistor is connected with the first preset voltage source, and a drain electrode of the seventh PMOS transistor is connected with a source electrode of the eighth PMOS transistor.

A gate electrode of the eighth PMOS transistor is connected with the ground terminal, and a drain electrode of the eighth PMOS transistor is connected with a drain electrode of the seventh NMOS transistor.

A gate electrode of the seventh NMOS transistor is connected with the ground terminal, and a source electrode of the seventh NMOS transistor is connected with a drain electrode of the eighth NMOS transistor.

A gate electrode of the eighth NMOS transistor is connected with the drain electrode of the fourth NMOS transistor, and a source electrode of the eighth NMOS transistor is connected with the second preset voltage source.

In the above solution, the control sub-circuit further includes a first resistor and a second resistor.

The first resistor is connected in series between the source electrode of the first NMOS transistor and the drain electrode of the second NMOS transistor.

The second resistor is connected in series between the source electrode of the third NMOS transistor and the drain electrode of the fourth NMOS transistor.

A level shifting method is further provided according to the embodiments of the disclosures. The method includes the following operations.

An input circuit performs inversion and delay operations on an input level signal to obtain a first level signal, a second level signal, a third level signal and a fourth level signal.

A rising edge of the first level signal occurs a first preset time earlier than a falling edge of the second level signal, and a falling edge of the first level signal occurs a second preset time later than a rising edge of the second level signal. The third level signal is a signal obtained by delaying the first level signal for a third preset time. The fourth level signal is a signal obtained by delaying the second level signal for a fourth preset time. The first preset time is longer than the third preset time, and the second preset time is longer than the fourth preset time.

The shifting circuit outputs a first voltage signal and a second voltage signal based on the level signals. The first voltage signal and the second voltage signal are inverted with each other.

In the above solution, the input circuit includes a first inverter, an RS trigger connected with the first inverter, a first delayer connected with a first output terminal of the RS trigger, and a second delayer connected with a second output terminal of the RS trigger.

The operation that the input circuit performs inversion and delay operations on the input level signal includes the following operations.

The first inverter inverts an input signal to obtain an inverted signal of the input signal.

The RS trigger obtains the first level signal and the second level signal based on the input signal and the inverted signal of the input signal.

The first delayer delays the first level signal to obtain the third level signal.

The second delayer delays the second level signal to obtain the fourth level signal.

With the level shifting circuit and method provided according to the embodiment of the disclosure, a level shifting circuit includes an input circuit and a shifting circuit connected with the input circuit, The input circuit is configured to perform inversion and delay operations on an input level signal to obtain a first level signal, a second level signal, a third level signal and a fourth level signal. A rising edge of the first level signal occurs a first preset time earlier than a falling edge of the second level signal, and a falling edge of the first level signal occurs a second preset time later than a rising edge of the second level signal. The third level signal is a signal obtained by delaying the first level signal for a third preset time. The fourth level signal is a signal obtained by delaying the second level signal for a fourth preset time. The first preset time is longer than the third preset time, and the second preset time is longer than the fourth preset time. The shifting circuit is configured to output a first voltage signal and a second voltage signal based on the level signals. The first voltage signal and the second voltage signal are inverted with each other. It can be seen that, in the embodiment of the disclosure, by regulating the timing sequence of the level signals, electric leakage is avoided, which is caused by a loop generated between the positive power supply VDD and the negative power supply VNEG in a case of simultaneous switch-on of PMOS transistor and NMOS transistor, that is, occurrence of the electric leakage can be reduced, thereby significantly reducing a dynamic current and reducing glitches at edges of the output voltage signals.

DETAILED DESCRIPTION

A level shifting circuit according to an embodiment of the disclosure is mainly applied in design for an integrated circuit. By regulating a timing sequence of level signals, electric leakage is avoided, which is caused by a loop generated between a positive power supply VDD and a negative power supply VNEG in a case of simultaneous switch-on of PMOS transistor and NMOS transistor, thereby significantly reducing a dynamic current and reducing glitches at edges of output voltage signals.

Purpose implementations, functional features and advantages of the disclosure will be further described referring to drawings in combination with the embodiments. It should be understood that the specific embodiments described herein are merely used for illustrating the disclosure rather than limiting the disclosure.

Figure 1:
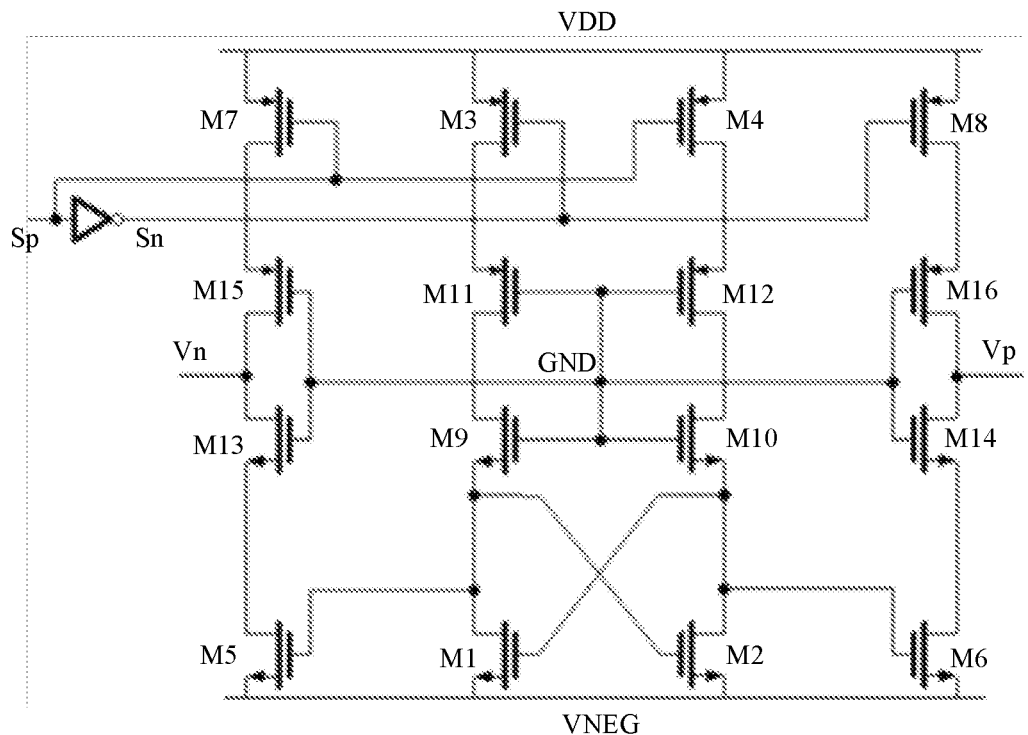
FIG. 1 is a schematic structural diagram of a circuit for implementing level shifting in design for an integrated circuit in a related art.
Figure 2:
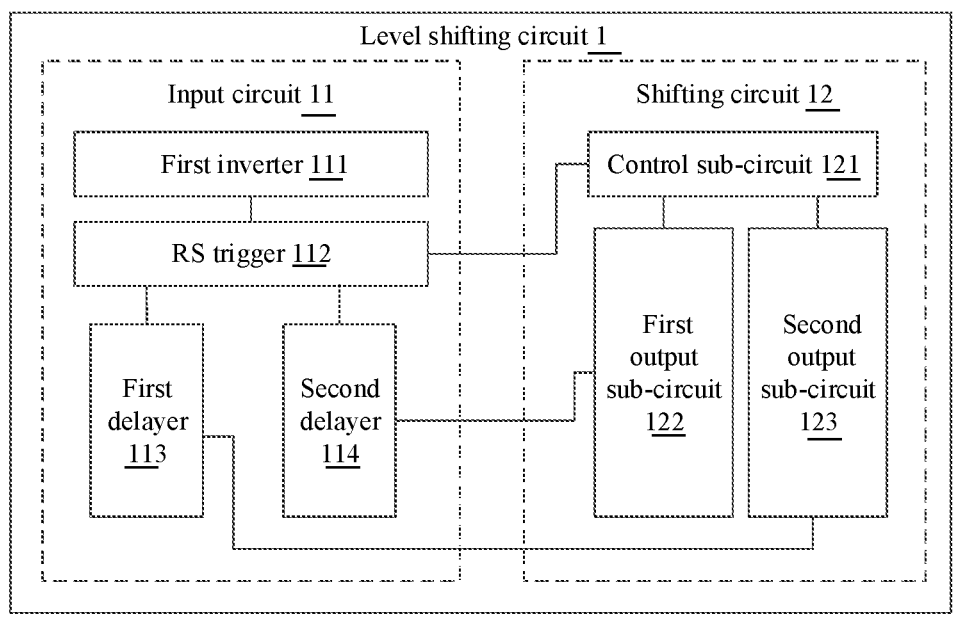
FIG. 2 is a schematic structural block diagram of a first embodiment of a level shifting circuit according to the disclosure.

FIG. 2 is a schematic structural block diagram of a first embodiment of a level shifting circuit according to the disclosure. Referring to FIG. 2, a level shifting circuit according to the embodiment includes an input circuit 11 and a shifting circuit 12 connected with the input circuit 11.

The input circuit 11 is configured to perform inversion and delay operations on an input level signal to obtain a first level signal, a second level signal, a third level signal and a fourth level signal.

A rising edge of the first level signal occurs a first preset time earlier than a falling edge of the second level signal, and a falling edge of the first level signal occurs a second preset time later than a rising edge of the second level signal. The third level signal is a signal obtained by delaying the first level signal for a third preset time. The fourth level signal is a signal obtained by delaying the second level signal for a fourth preset time. The first preset time is longer than the third preset time, and the second preset time is longer than the fourth preset time.

The shifting circuit 12 is configured to output a first voltage signal and a second voltage signal based on the level signals. The first voltage signal and the second voltage signal are inverted with each other.

The input circuit 11 includes a first inverter 111, an RS trigger 112 connected with the first inverter, a first delayer 113 connected with a first output terminal of the RS trigger 112 and a second delayer 114 connected with a second output terminal of the RS trigger 112.

The first inverter 111 is configured to invert an input signal to obtain an inverted signal of the input signal.

The RS trigger 112 is configured to obtain the first level signal and the second level signal based on the input signal and the inverted signal of the input signal.

Herein, by adjusting a resistance value of the RS trigger 112, the first preset time is longer than the third preset time, and the second preset time is longer than the fourth preset time.

In one embodiment, since a first input terminal of the RS trigger 112 is connected with an output terminal of the first inverter 111, the second input terminal of the RS trigger is connected with an input terminal of the first inverter 111, two input signals of the RS trigger 112 are signals which are inverted with each other and have a time delay therebetween. After the two input signals are latched by the RS trigger 112, the first level signal and the second level signal may be obtained.

The first delayer 113 is configured to delay the first level signal to obtain the third level signal.

Herein, the first delayer 113 may include an even number of second inverters, or may include a first transmission gate configured for delaying. In the following embodiments, the first delayer 113 is described in detail by taking an even number of second inverters as an example. In order to simplify a circuit structure, the number of the second inverters is two.

The second delayer 114 is configured to delay the second level signal to obtain the fourth level signal.

Herein, the second delayer 114 may include an even number of third inverters, or may include a second transmission gate configured for delaying. In the following embodiments, the second delayer 114 is described in detail by taking an even number of third inverters as an example. In order to simplify a circuit structure, the number of the third inverters is two.

The shifting circuit 12 includes a control sub-circuit 121, and a first output sub-circuit 122 and a second output sub-circuit 123 which are connected with the control sub-circuit 121.

The control sub-circuit 121 is configured to convert the first level signal to a first driving signal and convert the second level signal into a second driving signal.

The first output sub-circuit 122 is configured to output the first voltage signal based on the fourth level signal and the first driving signal.

The second output sub-circuit 123 is configured to output the second voltage signal based on the third level signal and the second driving signal.

In the embodiment of the disclosure, the level signals are not shifted simultaneously by regulating a timing sequence of the level signals through the input circuit, and a loop is avoided from being generated between the positive power supply and the negative power supply in a case of simultaneous switch-on of PMOS transistor and NMOS transistor, thereby reducing electric leakage and significantly reducing a dynamic current.

Figure 3:
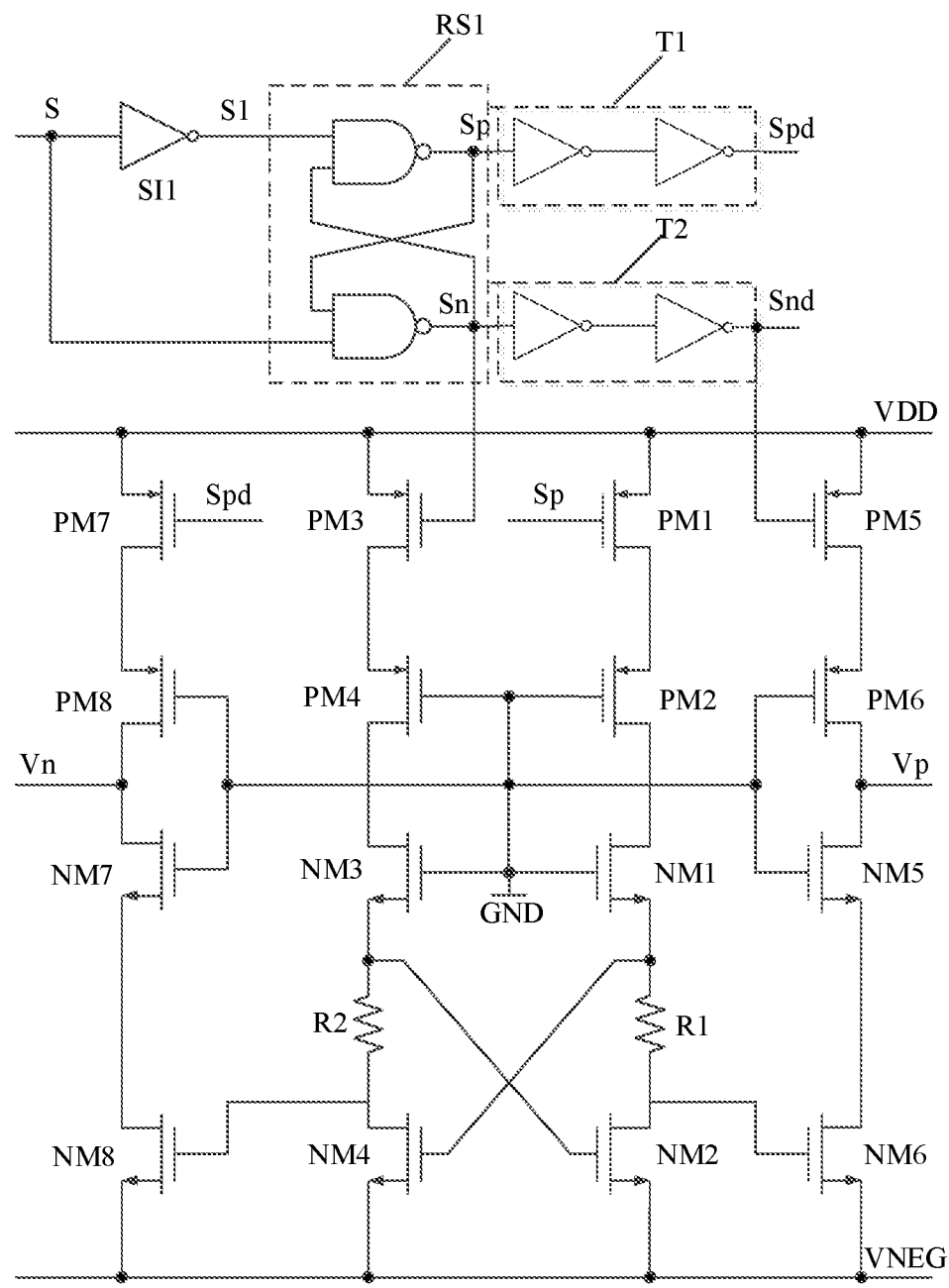
FIG. 3 is a schematic diagram showing a composition structure of a second embodiment of a level shifting circuit according to the disclosure.

FIG. 3 is a schematic diagram showing a composition structure of a second embodiment of a level shifting circuit according to the disclosure. Referring to FIG. 3, a level shifting circuit according to the embodiment includes a first inverter SI1, an RS trigger RS1, a first delayer T1, a second delayer T2, a first PMOS transistor PM1, a second PMOS transistor PM2, a third PMOS transistor PM3, a fourth PMOS transistor PM4, a fifth PMOS transistor PM5, a sixth PMOS transistor PM6, a seventh PMOS transistor PM7, an eighth PMOS transistor PM8, a first NMOS transistor NM1, a second NMOS transistor NM2, a third NMOS transistor NM3, a fourth NMOS transistor NM4, a fifth NMOS transistor NM5, a sixth NMOS transistor NM6, a seventh NMOS transistor NM7, an eighth NMOS transistor NM8, a first resistor and a second resistor.

The first inverter SI1, the RS trigger RS1, the first delayer T1 and the second delayer T2 constitute an input circuit. The first PMOS transistor PM1, the second PMOS transistor PM2, the third PMOS transistor PM3, the fourth PMOS transistor PM4, the first NMOS transistor NM1, the second NMOS transistor NM2, the third NMOS transistor NM3 and the fourth NMOS transistor NM4 constitute a control sub-circuit. The fifth PMOS transistor PM5, the sixth PMOS transistor PM6, the fifth NMOS transistor NM5 and the sixth NMOS transistor NM6 constitute a first output sub-circuit, the seventh PMOS transistor PM7, the eighth PMOS transistor PM8, the seventh NMOS transistor NM7 and the eighth NMOS transistor NM8 constitute a second output sub-circuit.

A connection relation of the level shifting circuit according to the embodiment is described as follows.

In the input circuit, two second inverters are connected in series to form the first delayer T1, and two third inverters are connected in series to form a second delayer T2. A first input terminal of the RS trigger RS1 is connected with an output terminal of the first inverter SI1, and a second input terminal of the RS trigger RS1 is connected with an input terminal of the first inverter SI1. A first output terminal of the RS trigger RS1 is connected with an input terminal of the first delayer T1, and a second output terminal of the RS trigger RS1 is connected with an input terminal of the second delayer T2.

In the control sub-circuit, a gate electrode of the first PMOS transistor PM1 is connected to the first output terminal, a source electrode of the first PMOS transistor PM1 is connected with a positive power supply VDD, a drain electrode of the first PMOS transistor PM1 is connected with a source electrode of the second PMOS transistor PM2. A gate electrode of the second PMOS transistor PM2 is connected with a ground terminal GND, a drain electrode of the second PMOS transistor PM2 is connected with a drain electrode of the first NMOS transistor NM1. A gate electrode of the third PMOS transistor PM3 is connected with the second output terminal, a source electrode of the third PMOS transistor PM3 is connected with the positive power supply VDD, and a drain electrode of the third PMOS transistor PM3 is connected with a source electrode of the fourth PMOS transistor PM4. A gate electrode of the fourth PMOS transistor PM4 is connected with the ground terminal GND, and a drain electrode of the fourth PMOS transistor PM4 is connected with a drain electrode of the third NMOS transistor NM3. A gate electrode of the first NMOS transistor NM1 is connected with the ground terminal GND, a source electrode of the first NMOS transistor NM1 is connected with a drain electrode of the second NMOS transistor NM2. A gate electrode of the second NMOS transistor NM2 is connected with a source electrode of the third NMOS transistor NM3, a source electrode of the second NMOS transistor NM2 is connected with the negative power supply VNEG. A gate electrode of the third NMOS transistor NM3 is connected with the ground terminal GND, a source electrode of the third NMOS transistor NM3 is connected with a drain electrode of the fourth NMOS transistor NM4. A gate electrode of the fourth NMOS transistor NM4 is connected with the source electrode of the first NMOS transistor NM1, and a source electrode of the fourth NMOS transistor NM4 is connected with the negative power supply VNEG.

In the first output sub-circuit, a gate electrode of the fifth PMOS transistor PM5 is connected with an output terminal of the second delayer T2, a source electrode of the fifth PMOS transistor PM5 is connected with the positive power supply VDD, and a drain electrode of the fifth PMOS transistor PM5 is connected with a source electrode of the sixth PMOS transistor PM6. A gate electrode of the sixth PMOS transistor PM6 is connected with the ground terminal GND, and a drain electrode of the sixth PMOS transistor PM6 is connected with a drain electrode of the fifth NMOS transistor NM5. A gate electrode of the fifth NMOS transistor NM5 is connected with the ground terminal GND, and a source electrode of the fifth NMOS transistor NM5 is connected with a drain electrode of the six NMOS transistor NM6. A gate electrode of the sixth NMOS transistor NM6 is connected with the drain electrode of the second NMOS transistor NM2, and a source electrode of the sixth NMOS transistor NM6 is connected with the negative power supply VNEG.

In the second output sub-circuit, a gate electrode of the seventh PMOS transistor PM7 is connected with an output terminal of the first delayer T1, a source electrode of the seventh PMOS transistor PM7 is connected with the positive power supply VDD, and a drain electrode of the seventh PMOS transistor PM7 is connected with a source electrode of the eighth PMOS transistor PM8. A gate electrode of the eighth PMOS transistor PM8 is connected with the ground terminal GND, and a drain electrode of the eighth PMOS transistor PM8 is connected with a drain electrode of the seventh NMOS transistor NM7. A gate electrode of the seventh NMOS transistor NM7 is connected with the ground terminal GND, and a source electrode of the seventh NMOS transistor NM7 is connected with a drain electrode of the eighth NMOS transistor NM8. A gate electrode of the eighth NMOS transistor NM8 is connected with the drain electrode of the fourth NMOS transistor NM4, and a source electrode of the eighth NMOS transistor NM8 is connected with the negative power supply VNEG.

In order to further reduce a dynamic current of a branch corresponding to the first PMOS transistor PM1 and increase a gate voltage of the fourth NMOS transistor NM4 when the first level signal is the ground level GND, and ensure that the second NMOS transistor NM2 can return to a switch-off state through a feedback loop, the control sub-circuit further includes a first resistor R1. In order to further reduce a dynamic current of a branch corresponding to the second PMOS transistor PM2 and increase the gate voltage of the second NMOS transistor NM2 when the second level signal is the ground level GND, and ensure that the fourth NMOS transistor NM4 can return to the switch-off state through a feedback loop, the control sub-circuit further includes the second resistor R2. The first resistor R1 is connected in series between the source electrode of the first NMOS transistor NM1 and the drain electrode of the second NMOS transistor NM2. The second resistor R2 is connected in series between the source electrode of the third NMOS transistor NM3 and the drain electrode of the fourth NMOS transistor NM4.

Figure 4:
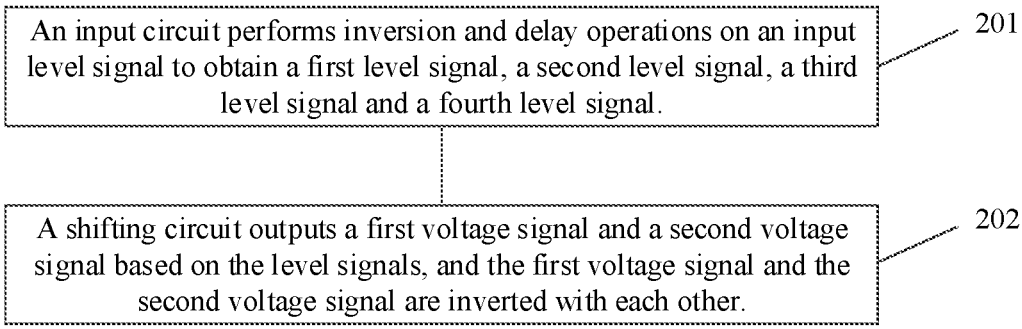
FIG. 4 is a schematic diagram showing an implementation flow of a first embodiment of a level shifting method according to the disclosure.

FIG. 4 is a schematic diagram showing an implementation flow of a first embodiment of a level shifting method according to the disclosure. Referring to FIG. 4, a level shifting method according to the embodiment includes steps 201 and 202.

In step 201, an input circuit performs inversion and delay operations on an input level signal to obtain a first level signal, a second level signal, a third level signal and a fourth level signal.

A rising edge of the first level signal occurs a first preset time earlier than a falling edge of the second level signal, and a falling edge of the first level signal occurs a second preset time later than a rising edge of the second level signal. The third level signal is a signal obtained by delaying the first level signal for a third preset time, and the fourth level signal is a signal obtained by delaying the second level signal for a fourth preset time. The first preset time is longer than the third preset time, and the second preset time is longer than the fourth preset time.

The input circuit includes a first inverter, an RS trigger connected with the first inverter, a first delayer connected with a first output terminal of the RS trigger and a second delayer connected with a second output terminal of the RS trigger.

Figure 5:
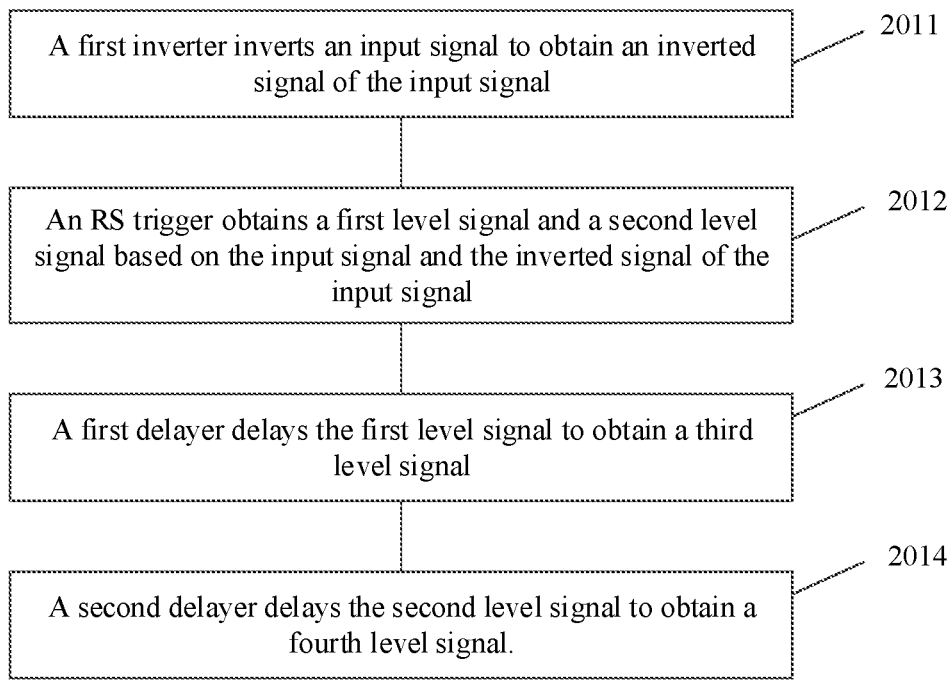
FIG. 5 is a schematic diagram showing a detailed flow in which an input circuit performs inversion and delay operations on an input level signal in the implementation flow shown in FIG. 4.

FIG. 5 is a schematic diagram showing a detailed flow in which the input circuit performs inversion and delay operations on an input level signal in the implementation flow shown in FIG. 4. Referring to FIG. 5, step 201 includes steps 2011 to 2014.

In step 2011, the first inverter inverts an input signal to obtain an inverted signal of the input signal.

In step 2012, the RS trigger obtains a first level signal and a second level signal based on the input signal and the inverted signal of the input signal.

In step 2013, the first delayer delays the first level signal to obtain a third level signal.

In step 2014, the second delayer delays the second level signal to obtain a fourth level signal.

In step 202, the shifting circuit outputs a first voltage signal and a second voltage signal based on the level signals. The first voltage signal and the second voltage signal are inverted with each other.

It may be understood that a dynamic current can be significantly reduced by regulating a timing sequence of the level signals through the input circuit, it is because the first level signal, the second level signal, the third level signal, and the fourth level signal are not shifted simultaneously by adjusting the timing sequence of the level signals during a process of shifting the input level signal. Therefore, a loop is avoided from being generated between the positive power supply and the negative power supply in a case of simultaneous shifting of the level signals, thereby significantly reducing the dynamic current.

The composition structure of the level shifting circuit according to the disclosure and the implementation flow of the level shifting method according to the disclosure are described in detail as above. In the second embodiment of the level shifting method according to the disclosure, an operation principle of the level shifting circuit is described in detail based on the level shifting circuit of the second embodiment of the circuit.

Figure 6:
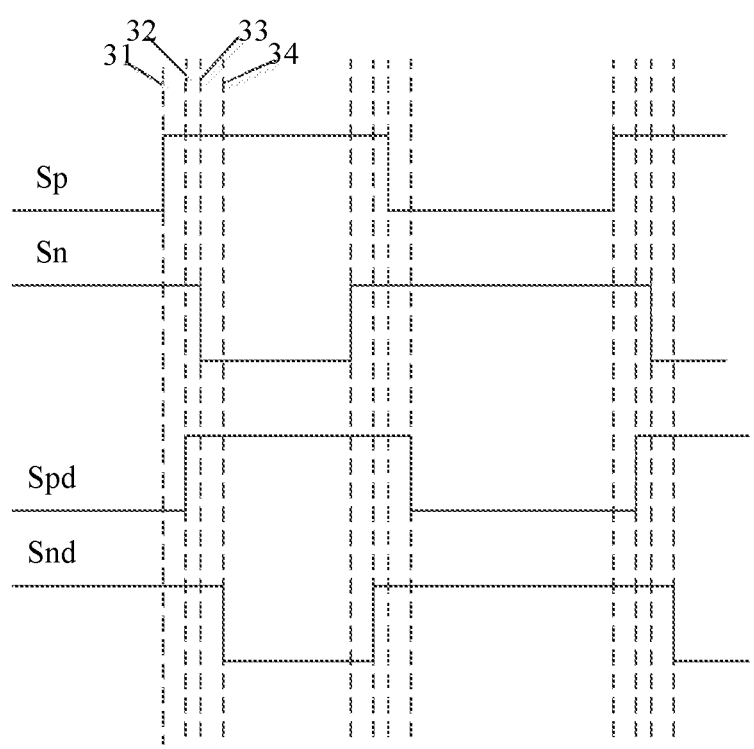
FIG. 6 is a schematic diagram showing a level signal in an input circuit according to an embodiment of the disclosure.

FIG. 6 is a schematic diagram showing a level signal in an input circuit. Referring to FIG. 6, a first preset time is denoted by an interval between a dotted line 31 and a dotted line 33, a third preset time is denoted by an interval between the dotted line 31 and a dotted line 32, a fourth preset time is denoted by an interval between the dotted line 33 and a dotted line 34. Since signals which are inverted with each other and have a time delay therebetween are inputted into an input terminal of an RS trigger RS1, the first preset time is equal to the second preset time, the first preset time is longer than the third preset time, and the second preset time is longer than the fourth preset time. In this way, the level signals may not be shifted simultaneously, and normal operation of the level shifting circuit can be ensured.

An operation principle of an input circuit is described below in combination with FIG. 3 and FIG. 6.

First, after an input level signal S is transferred through a first inverter SI1, a signal S1 is outputted. The signal S1 and the input level signal S are inverted with each other and have a time delay therebetween. When the input level signal S is shifted from a low level to a high level, two input terminals of the RS trigger RS1 have simultaneously an active signal since the signal S1 remains at the high level. Therefore, a first level signal Sp and a second level signal Sn are simultaneously outputted at the high level, and the second level signal Sn is not at the low level until the signal S1 is at a low level. Similarly, when the input level signal S is shifted from the high level to the low level, the two input terminals of the RS trigger RS1 are simultaneously at the low level since the signal S1 remains at the low level. Therefore, the first level signal Sp and the second level signal Sn are simultaneously outputted at the high level, and the first level signal Sp is not at the low level until the signal S1 is at the high level. Then, the first level signal Sp is transferred through a first delayer T1 to obtain a third level signal Spd, and the second level signal Sn is transferred through the second delayer T2 to obtain a fourth level signal Snd. By increasing a resistance value of the RS trigger RS1, the first preset time is longer than the third preset time and the second preset time is longer than the fourth preset time.

An operation principle of a shifting circuit is described below in combination with FIG. 3 and FIG. 6.

First, in a case that the first level signal Sp is at the low level, the second level signal Sn is at the high level, a first PMOS transistor PM1 is switched on, and a third PMOS transistor PM3 is switched off. A current of a branch corresponding to the first PMOS transistor PM1 flows from a positive power supply VDD to a negative power supply VNEG. Due to a resistance of a second NMOS transistor NM2 and the first resistor, a source voltage of a first NMOS transistor NM1 is greater than the negative power supply VNEG, the source voltage is fed back to a gate electrode of a fourth NMOS transistor NM4, to enable the fourth NMOS transistor NM4 to be switched on. After the fourth NMOS transistor NM4 is switched on, a second driving signal is generated in an eighth NMOS transistor NM8. A second output sub-circuit outputs a second voltage signal Vn based on the third level signal Spd and the second driving signal. The source voltage of the third NMOS transistor NM3 decreases due to the switch-on of the fourth NMOS transistor NM4, and the source voltage is fed back to the gate electrode of the second NMOS transistor NM2, to enable the second NMOS transistor NM2 to be switched off. After the second NMOS transistor NM2 is switched off, a first driving signal is generated at a gate electrode of a sixth NMOS transistor NM6. A first output sub-circuit outputs a first voltage signal Vp based on the fourth level signal Snd and the first driving signal.

In this case, in the first level state, the second level state, the third level state and the fourth level state, a fifth NMOS transistor NM5 and the sixth NMOS transistor NM6 are switched on while a fifth PMOS transistor PM5 and a sixth PMOS transistor PM6 are switched off, and the first voltage signal Vp is the negative power supply VNEG. A seventh NMOS transistor NM7 and an eighth NMOS transistor NM8 are switched off while a seventh PMOS transistor PM7 and an eighth PMOS transistor PM8 are switched on, and the second voltage signal Vn is the positive power supply VDD.

Further, in a case that the first level signal Sp is at the high level, the second level signal Sn is at the low level, the first PMOS transistor PM1 is switched off, and the third PMOS transistor PM3 is switched on. A current of a branch corresponding to the third PMOS transistor PM3 flows from the positive power supply VDD to the negative power supply VNEG. Due to a resistance of the fourth NMOS transistor NM4 and a second resistor, the source voltage of the third NMOS transistor NM3 is greater than the negative power supply VNEG, the source voltage is fed back to a gate electrode of the second NMOS transistor NM2, to enable the second NMOS transistor NM2 to be switched on. After the second NMOS transistor NM2 is switched on, a first driving signal is generated at a gate electrode of the sixth NMOS transistor. The first output sub-circuit outputs the first voltage signal Vp based on the fourth level signal Snd and the first driving signal. The source voltage of the first NMOS transistor NM1 decreases due to the switch-on of the second NMOS transistor NM2, and the source voltage is fed back to a gate electrode of the fourth NMOS transistor NM4 to enable the fourth NMOS transistor NM4 to be switched off. After the fourth NMOS transistor NM4 is switched off, a second driving signal is generated at the gate electrode of the eighth NMOS transistor NM8. The second output sub-circuit outputs the second voltage signal Vn based on the third level signal Spd and the second driving signal.

In this case, in the first level state, the second level state, the third level state, and the fourth level state, the fifth NMOS transistor NM5 and the sixth NMOS transistor NM6 are switched off while and the fifth PMOS transistor PM5 and the sixth PMOS transistor PM6 are switched on, and the first voltage signal Vp is a negative power supply VDD. The seventh NMOS transistor NM7 and the eighth NMOS transistor NM8 are switched on while the seventh PMOS transistor PM7 and the eighth PMOS transistor PM8 are switched off, and the second voltage signal Vn is the negative power supply VNEG.

It should be noted that, the first level signal Sp and the second level signal Sn are not shifted simultaneously by regulating the timing sequence of the first level signal Sp and the second level signal Sn, which can avoid a loop from being generated between the positive power supply VDD and the negative power supply VNEG in a case of simultaneous switch-on of the first PMOS transistor PM1 and the second NMOS transistor NM2 and simultaneous switch-on of the third PMOS transistor PM3 and the fourth NMOS transistor NM4. The first level signal Sp and the fourth level signal Snd are not shifted simultaneously by regulating the timing sequence of the first level signal Sp and the fourth level signal Snd, which can avoid a loop from being generated between the positive power supply VDD and the negative power supply VNEG in a case of simultaneous switch-on of the fifth PMOS transistor PM5 and the sixth NMOS transistor NM6. The second level signal Sn and the third level signal Spd are not shifted simultaneously by regulating the timing sequence of the second level signal Sn and the third level signal Spd, which can avoid a loop from being generated between the positive power supply VDD and the negative power supply VNEG in a case of simultaneous switch-on of the seventh PMOS transistor PM7 and the eighth NMOS transistor NM8, thereby significantly reducing the dynamic current.

The foregoing is only the preferred embodiment of the disclosure rather than limiting the protection scope of the disclosure. Any modifications, equivalent substitution, improvements and the like made within the spirit and scope of the disclosure all fall within the protection scope of the disclosure.

In the solution provided according to the embodiments of the disclosure, an input circuit performs inversion and delay operations on an input level signal to obtain a first level signal, a second level signal, a third level signal and a fourth level signal. A rising edge of the first level signal occurs a first preset time earlier than a falling edge of the second level signal, and a falling edge of the first level signal occurs a second preset time later than a rising edge of the second level signal. The third level signal is a signal obtained by delaying the first level signal for a third preset time, and the fourth level signal is a signal obtained by delaying the second level signal for a fourth preset time. The first preset time is longer than the third preset time, and the second preset time is longer than the fourth preset time. The shifting circuit outputs a first voltage signal and a second voltage signal based on the level signals. The first voltage signal and the second voltage signal are inverted with each other. It can be seen that, by regulating the timing sequence of the level signals in the embodiment of the disclosure, a loop is avoided from being generated between a positive power supply VDD and a negative power supply VNEG in a case of simultaneous switch-on of the PMOS transistor and the NMOS transistor, thereby reducing occurrence of the electric leakage, and further significantly reducing a dynamic current and reducing glitches at edges of the output voltage signals.

The invention claimed is:

1. A level shifting circuit, comprising an input circuit, and a shifting circuit connected with the input circuit, wherein:
   the input circuit is configured to perform inversion and delay operations on an input level signal to obtain a first level signal, a second level signal, a third level signal and a fourth level signal;
   a rising edge of the first level signal occurs a first preset time earlier than a falling edge of the second level signal, and a falling edge of the first level signal occurs a second preset time later than a rising edge of the second level signal; the third level signal is a signal obtained by delaying the first level signal for a third preset time, and the fourth level signal is a signal obtained by delaying the second level signal for a fourth preset time; the first preset time is longer than the third preset time, the second preset time is longer than the fourth preset time;
   the shifting circuit is configured to output a first voltage signal and a second voltage signal based on the level signals, and the first voltage signal and the second voltage signal are inverted with each other;
   the input circuit comprises a first inverter, an RS latch connected with the first inverter, a first delayer connected with a first output terminal of the RS latch and a second delayer connected with a second output terminal of the RS latch;
   the first inverter is configured to invert an input signal to obtain an inverted signal of the input signal;
   the RS latch is configured to obtain the first level signal and the second level signal based on the input signal and the inverted signal of the input signal;
   the first delayer is configured to delay the first level signal to obtain the third level signal;
   the second delayer is configured to delay the second level signal to obtain the fourth level signal;
   the shifting circuit comprises a control sub-circuit, and a first output sub-circuit and a second output sub-circuit which are connected with the control sub-circuit;
   the control sub-circuit is configured to convert the first level signal to a first driving signal, and convert the second level signal into a second driving signal;
   the first output sub-circuit is configured to output the first voltage signal based on the fourth level signal and the first driving signal; and
   the second output sub-circuit is configured to output the second voltage signal based on the third level signal and the second driving signal.

2. The level shifting circuit according to claim 1, wherein the first delayer comprises an even number of second inverters, or a first transmission gate configured for delaying.

3. The level shifting circuit according to claim 1, wherein the second delay comprises an even number of third inverters, or a second transmission gate configured for delaying.

4. The level shifting circuit according to claim 1, wherein:
   the control sub-circuit comprises a first PMOS transistor, a second PMOS transistor, a third PMOS transistor, a fourth PMOS transistor, a first NMOS transistor, and a second NMOS transistor, a third NMOS transistor and a fourth NMOS transistor;
   a gate electrode of the first PMOS transistor is connected with the first output terminal, a source electrode of the first PMOS transistor is connected with a first preset voltage source, and a drain electrode of the first PMOS transistor is connected with a source electrode of the second PMOS transistor;
   a gate electrode of the second PMOS transistor is connected with a ground terminal, and a drain electrode of the second PMOS transistor is connected with a drain electrode of the first NMOS transistor;
   a gate electrode of the third PMOS transistor is connected with the second output terminal, a source electrode of the third PMOS transistor is connected with the first preset voltage source, and a drain electrode of the third PMOS transistor is connected with a source electrode of the fourth PMOS transistor;
   a gate electrode of the fourth PMOS transistor is connected with the ground terminal, and a drain electrode of the fourth PMOS transistor is connected with a drain electrode of the third NMOS transistor;
   a gate electrode of the first NMOS transistor is connected with the ground terminal, and a source electrode of the first NMOS transistor is connected with a drain electrode of the second NMOS transistor;
   a gate electrode of the second NMOS transistor is connected with a source electrode of the third NMOS transistor, and a source electrode of the second NMOS transistor is connected with a second preset voltage source;
   a gate electrode of the third NMOS transistor is connected with the ground terminal, and a source electrode of the third NMOS transistor is connected with a drain electrode of the fourth NMOS transistor; and
   a gate electrode of the fourth NMOS transistor is connected with the source electrode of the first NMOS transistor, and a source electrode of the fourth NMOS transistor is connected with the second preset voltage source.

5. The level shifting circuit according to claim 4, wherein:
   the first output sub-circuit comprises a fifth PMOS transistor, a sixth PMOS transistor, a fifth NMOS transistor and a sixth NMOS transistor;
   a gate electrode of the fifth PMOS transistor is connected with an output terminal of the second delayer, a source electrode of the fifth PMOS transistor is connected with the first preset voltage source, and a drain electrode of the fifth PMOS transistor is connected with a source electrode of the sixth PMOS transistor;
   a gate electrode of the sixth PMOS transistor is connected with the ground terminal, and a drain electrode of the sixth PMOS transistor is connected with a drain electrode of the fifth NMOS transistor;
   a gate electrode of the fifth NMOS transistor is connected with the ground terminal, and a source electrode of the fifth NMOS transistor is connected with a drain electrode of the sixth NMOS transistor; and
   a gate electrode of the sixth NMOS transistor is connected with the drain electrode of the second NMOS transistor, and the source electrode of the sixth NMOS transistor is connected with the second preset voltage source.

6. The level shifting circuit according to claim 4, wherein:
   the second output sub-circuit comprises a seventh PMOS transistor, an eighth PMOS transistor, a seventh NMOS transistor and an eighth NMOS transistor;
   a gate electrode of the seventh PMOS transistor is connected with an output terminal of the first delayer, a source electrode of the seventh PMOS transistor is connected with the first preset voltage source, and a drain electrode of the seventh PMOS transistor is connected with a source electrode of the eighth PMOS transistor;

a gate electrode of the eighth PMOS transistor is connected with the ground terminal, and a drain electrode of the eighth PMOS transistor is connected with a drain electrode of the seventh NMOS transistor;

a gate electrode of the seventh NMOS transistor is connected with the ground terminal, and a source electrode of the seventh NMOS transistor is connected with a drain electrode of the eighth NMOS transistor; and a gate electrode of the eighth NMOS transistor is connected with the drain electrode of the fourth NMOS transistor, and a source electrode of the eighth NMOS transistor is connected with the second preset voltage source.

7. The level shifting circuit according to claim 4, wherein:
the control sub-circuit further comprises a first resistor and a second resistor;

the first resistor is connected in series between the source electrode of the first NMOS transistor and the drain electrode of the second NMOS transistor; and the second resistor is connected in series between the source electrode of the third NMOS transistor and the drain electrode of the fourth NMOS transistor.

8. A level shifting method, comprising:
performing, by an input circuit, inversion and delay operations on an input level signal to obtain a first level signal, a second level signal, a third level signal and a fourth level signal, wherein a rising edge of the first level signal occurs a first preset time earlier than a falling edge of the second level signal, and a falling edge of the first level signal occurs a second preset time later than a rising edge of the second level signal, the third level signal is a signal obtained by delaying the first level signal for a third preset time, and the fourth level signal is a signal obtained by delaying the second level signal for a fourth preset time, the first preset time is longer than the third preset time, and the second preset time is longer than the fourth preset time; and outputting, by a shifting circuit, a first voltage signal and a second voltage signal based on the level signals, wherein the first voltage signal and the second voltage signal are inverted with each other;

wherein:

the input circuit comprises a first inverter, an RS latch connected with the first inverter, a first delayer connected with a first output terminal of the RS latch and a second delayer connected with a second output terminal of the RS latch;

the first inverter is configured to invert an input signal to obtain an inverted signal of the input signal;

the RS latch is configured to obtain the first level signal and the second level signal based on the input signal and the inverted signal of the input signal;

the first delayer is configured to delay the first level signal to obtain the third level signal;

the second delayer is configured to delay the second level signal to obtain the fourth level signal;

the shifting circuit comprises a control sub-circuit, and a first output sub-circuit and a second output sub-circuit which are connected with the control sub-circuit;

the control sub-circuit is configured to convert the first level signal to a first driving signal, and convert the second level signal into a second driving signal;

the first output sub-circuit is configured to output the first voltage signal based on the fourth level signal and the first driving signal; and the second output sub-circuit is configured to output the second voltage signal based on the third level signal and the second driving signal.

9. The level shifting method according to claim 8, wherein the performing, by the input circuit, inversion and delay operations on the input level signal comprises:

inverting, by the first inverter, an input signal to obtain an inverted signal of the input signal;

obtaining, by the RS latch, the first level signal and the second level signal based on the input signal and the inverted signal of the input signal;

delaying, by the first delayer, the first level signal to obtain the third level signal; and delaying, by the second delayer, the second level signal to obtain the fourth level signal.

\* \* \* \* \*